(12) United States Patent
Hanhimäki et al.

(10) Patent No.: US 8,850,102 B2
(45) Date of Patent: Sep. 30, 2014

(54) FLASH MEMORY WITH SMALL DATA PROGRAMMING CAPABILITY

(75) Inventors: Petteri Hanhimäki, Salo (FI); Ilpo Jarvinen, Pyoli (FI)

(73) Assignee: Nokia Corporation, Espoo (FI)

( * ) Notice: Subject to any disclaimer, the term of this patent is extended or adjusted under 35 U.S.C. 154(b) by 948 days.

(21) Appl. No.: 11/895,611

(22) Filed: Aug. 23, 2007

(65) Prior Publication Data

US 2009/0055575 A1    Feb. 26, 2009

(51) Int. Cl.
*G06F 12/00* (2006.01)
*G11C 16/10* (2006.01)

(52) U.S. Cl.
CPC ........................ *G11C 16/10* (2013.01)
USPC ............... 711/103; 711/154; 711/E12.008

(58) Field of Classification Search
None
See application file for complete search history.

(56) References Cited

U.S. PATENT DOCUMENTS

| | | | |
|---|---|---|---|
| 6,222,775 B1 * | 4/2001 | Cappelletti | 365/185.29 |
| 7,580,295 B2 * | 8/2009 | Lee et al. | 365/189.02 |
| 2005/0251617 A1 * | 11/2005 | Sinclair et al. | 711/103 |
| 2007/0083697 A1 | 4/2007 | Birrell et al. | 711/170 |
| 2007/0147116 A1 | 6/2007 | Qawami et al. | |
| 2007/0283082 A1 * | 12/2007 | Laurent et al. | 711/103 |
| 2008/0068897 A1 * | 3/2008 | Lee et al. | 365/189.02 |
| 2009/0027950 A1 * | 1/2009 | Lam et al. | 365/163 |

FOREIGN PATENT DOCUMENTS

| | | | | |
|---|---|---|---|---|
| CN | 1524227 A | | 8/2004 | |
| EP | 0704851 A1 * | | 4/1996 | G11C 16/00 |
| KR | 10-2008-0025927 A * | | 3/2008 | G11C 7/22 |
| KR | 10-0843142 B1 * | | 7/2008 | G11C 7/22 |

OTHER PUBLICATIONS

Spansion. "S71NS-N MCP Products—MirrorBit 1.8 Volt-only Simultaneous Read/Write Burst-mode Multiplexed Flash Memory" Advance Information Data Sheet. Spansion Pub. No. S71NS-N_00 A3, published Oct. 10, 2006.*
Intel StrataFlash® Cellular Memory (M18), Order No. 309823, Revision 1, Oct. 24, 2005, 126 pages.

* cited by examiner

*Primary Examiner* — Matthew Bradley
*Assistant Examiner* — Daniel Bernard
(74) *Attorney, Agent, or Firm* — Harrington & Smith

(57) ABSTRACT

A method comprises receiving a request to access a memory array having one or more memory erase units with a data area of flash array and with a specific amount of memory which offers small data programming capability, the specific amount of memory configured to be erased simultaneously or sequentially with a main memory block of the memory array; and if the memory access request includes programming small data, then providing access to the specific amount of memory, or if the memory access request does not include programming small data, then providing access to the data area of flash array. The size of the specific amount of memory may be pre-defined, and the specific amount of memory may be a different memory technology.

42 Claims, 4 Drawing Sheets

The Flash Memory Device

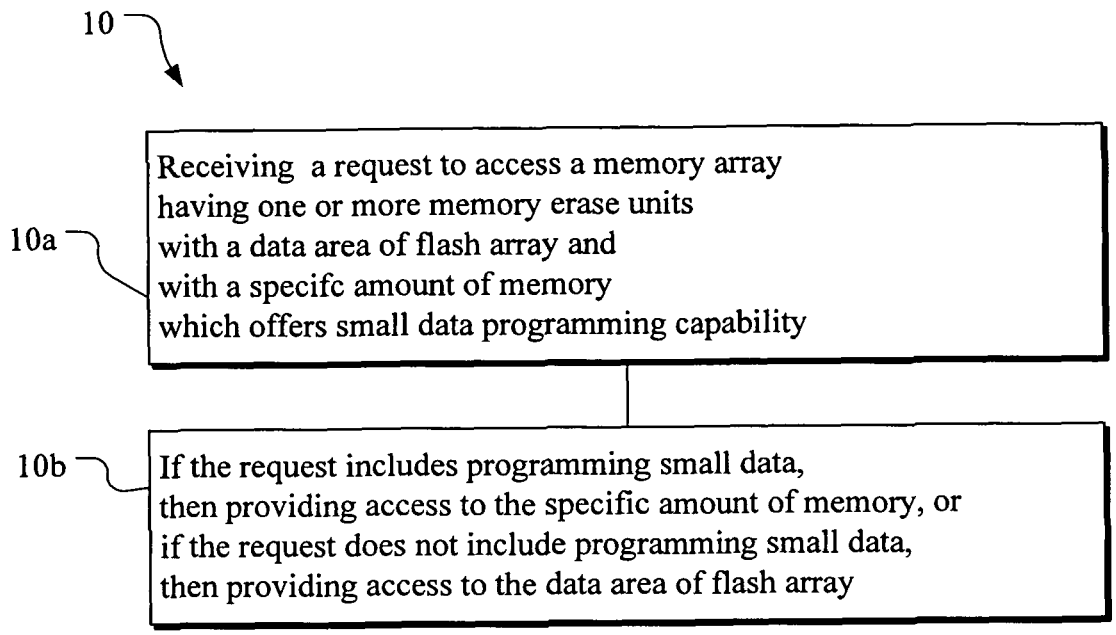
Figure 1: The Basic Method
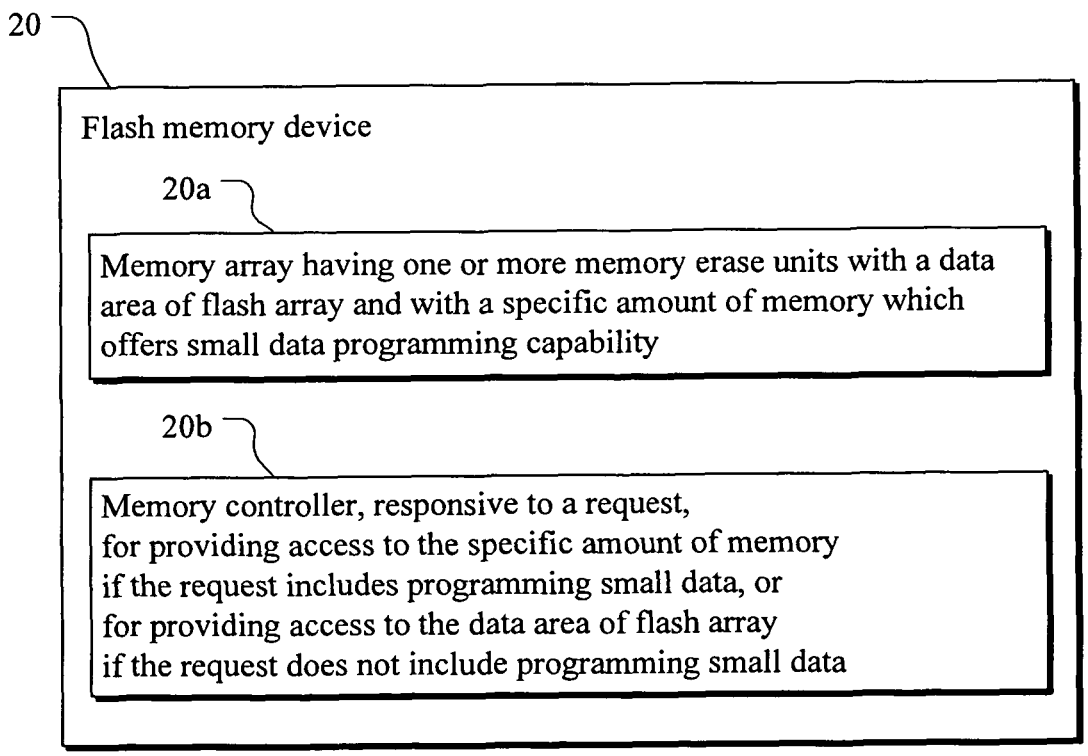
Figure 2: The Flash Memory Device

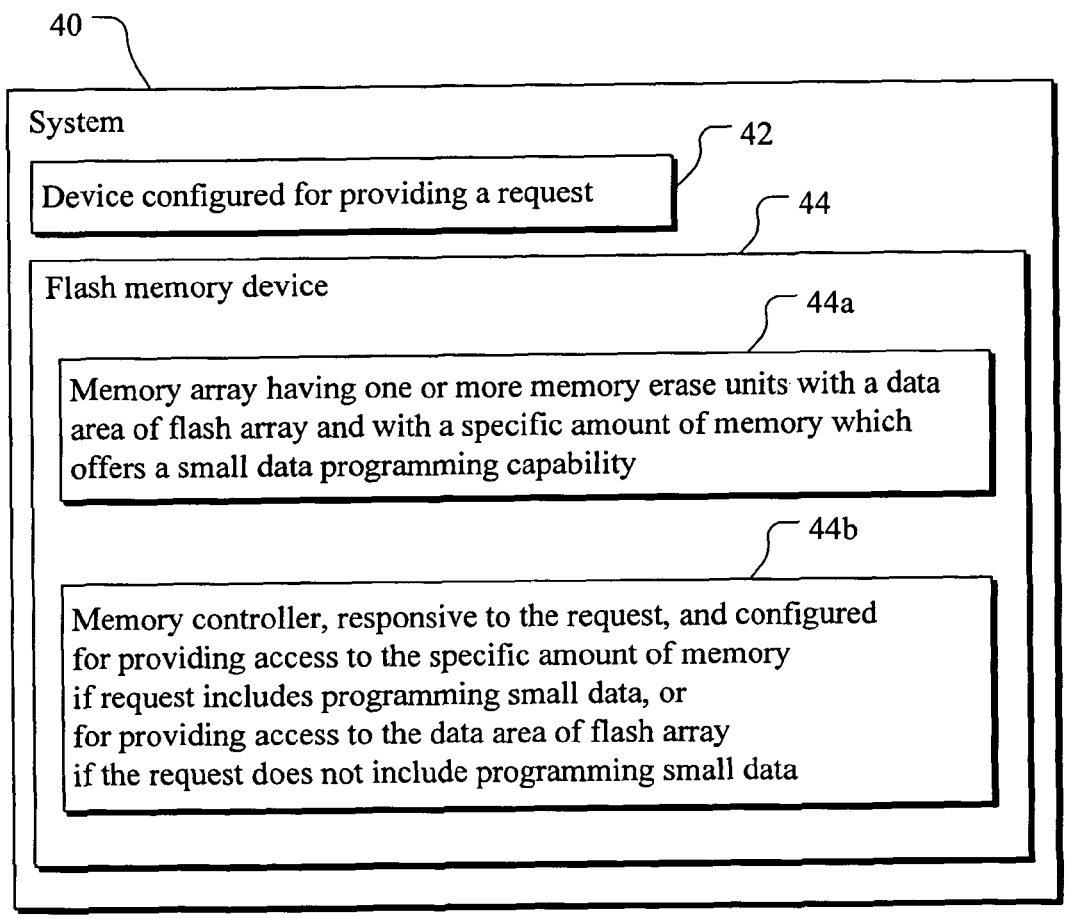
Figure 5: The Basic System

FLASH MEMORY WITH SMALL DATA PROGRAMMING CAPABILITY

BACKGROUND OF THE INVENTION

1. Field of Invention

The present invention relates to flash memory; and more particularly to a method and apparatus for providing small programming capability in such flash memory.

2. Description of Related Art

Non-volatile flash memories are widely used in different kinds of consumer products (and also other technical devices having embedded software (SW) and/or data storing capabilities). Because smaller packages are needed to make smaller mobile devices, and because going to smaller memory die processes offer component price benefits, non-volatile memory devices are shrunk to smaller lithographs (130 nm→110 nm→90 nm→65 nm→) which at some point will increase the need of having error correction in NOR flash. As the memory cell gets smaller, the probability of getting an erroneous read also increases. Error correction is commonly done for some specific amount of memory cells which limits the write size to this same amount of cells. (if error correction is done for 512 Bytes, usually each write is also limited to the same size as the error correction area). Depending on memory technology, there may be multiple bits stored to the same memory cell (Multi Level Cell (MLC)) or just one bit. Bits are commonly identified as different voltage levels (current levels) in the memory cell and thus MLC is more prone to have errors (e.g., if a cell can have voltages between 0-5 volts, 0 would be 0-1.5 volts and 1 would be 2-5 volts). If multiple bits are stored to same cell with different voltage levels, the difference between different states is smaller and thus reading/programming is more sensitive. If some data needs smaller writes than this error correction area, some devices support also other programming modes but commonly a part of a memory array is not accessible anymore after using that programming mode.

In other words, when non-volatile memory technology like NOR is shrunk enough/too much, it will create the need of having error correction for preventing the error bits during reads. When error correction is implemented on the nonvolatile memory side, it usually limits the write granularity/minimum write size as error correction is implemented in memory over each specific unit. This kind of error correction is already implemented at least in the known Intel M18 device family (Multi level Cell NOR flash memory devices) This kind of limitation creates problems for flash file systems as those normally have also internal data which has validity information of the data (this is valid for Read/Write flash file systems). Memory devices also have the possibility to still write smaller units, but implementation varies between memory manufacturers and makes it very difficult to have size effective flash file system implementation in products that would support flash memory devices from several memory manufacturers.

In particular, flash file system becomes complex and guessing of different memory array areas is difficult/impossible if the memory array configuration is changed in a product, as the flash file system needs to have pre-defined information about how the memory needs to be accessed. Pre-generated production images for flash devices become different as error correction areas are not a standard size. Other reasons for limiting programming granularity is programming performance if programming buffers are used more parallelism can be implemented inside the memory device and/or more sophisticated programming algorithm for the memory cells can be implemented inside the memory device.

Error correction NOR memory devices have different programming modes for the whole memory array. Flash file system knows (defined in source code) how memory needs to be accessed. This varies between flash memory generations.

In the Intel M18 device family solution, there is the possibility to choose inside each error correction area (several inside each erase unit) whether it is used in a single level cell programming mode (which is bit manipulation capable and thus suitable for flash file system small control data), or in a multi level cell programming mode (which is not bit manipulation capable as error correction implementation prevents that). That is, the Intel M18 has two programming modes, a Control Mode and an Object mode, the first of them being suitable for Flash File System or Header information. Control Mode and Object Mode programming regions can be intermingled within the erase block, where a programming region is 1 kB, and thus a programming mode can be changed only at 1 kB intervals. However, the programming mode of any region within a block can be changed only after erasing the entire block.

In addition, US 2007/0147116 discloses the use of blocks of flash memory outside of the main flash memory array for small parameter storage. The purpose of this solution is to keep the main flash memory array symmetrical by storing small data apart from it, i.e. to an extended flash array (EFA).

In Intel's solution, EFA blocks need to be erased separately as they are not connected to blocks of main flash memory array. Further, EFA blocks are mapped on top of a "regular" address space by issuing an EFA command, and thus the main array block cannot be written or read.

Further, it is understood that in Intel's solution erase blocks are of "normal" (or conventional) size (e.g. 128 kB) and in addition to them there are some EFA blocks (e.g. 4 kB). Those are conventional block sizes.

In view of this, there is a need in the art for a technique for providing small programming capability in non-volatile flash memory.

SUMMARY OF THE INVENTION

The present invention provides a new and unique method and apparatus that features receiving a request to access a memory array having one or more memory erase units with a data area of flash array and with a specific amount of memory which offers small data programming capability; and if the memory access request includes programming small data, then providing access to the specific amount of memory, or if the memory access request does not include programming small data, then providing access to the data area of flash array. The accessing may include memory programming capabilities such as reading, writing or erasing the programming data to or from the specific amount of memory.

According to some embodiments of the present invention, the size of that memory area is pre-defined. The memory area which allows this smaller data (bit manipulation/byte write/word write) programming and overwriting (changing more bits/bytes to 0 in same area) can be even a different technology but making it more cost effective from a product point of view. Implementation can be done differently based on a memory interface. The memory device must be implemented in that way that a small data area can be erased simultaneously or sequentially (with one command or sequential commands) with the main block (if the small data area is located in a different erase unit). Data units which create an erase unit can be in same erase unit as the small data area. The memory array doesn't have holes (areas which can not be accessed/or doesn't have valid data).

According to some embodiments of the present invention, a small data area may be located into the same memory erase unit as a main block or into a different memory erase unit as the main block.

The memory array may form part of e.g. a MUX-NOR interface memory device, as well as a low power double data rate II (LP-DDR2) interface memory device. For example, for an address data muxed NOR, the same input/output (I/O)-lines may be used for data and address. Also, similar devices may be implemented for a standard NOR interface.

The method may also comprise implementing the step of the method via a computer program running in a processor, controller or other suitable module in the user equipment, such as a mobile phone, terminal or device.

In some embodiments of the present invention, the apparatus may take the form of a flash memory device featuring such a memory array having one or more memory erase units with such a data area of flash array and with such a specific amount of memory which offers small data programming capability, and such a memory controller, responsive to such a memory access request, and configured for providing access to the specific amount of memory if the memory access request includes programming small data, or for providing access to the data area of flash array if the memory access request does not include programming small data.

In some embodiments of the present invention, the apparatus may take the form of a system featuring a device configured for providing such a memory access request; and such a flash memory device having such a memory array having one or more memory erase units with such a data area of flash array and with such a specific amount of memory which offers small data programming capability, and such a memory controller, responsive to the memory access request, and being configured for providing access to the specific amount of memory if the memory access request includes programming small data, or for providing access to the data area of flash array if the memory access request does not include programming small data.

In some embodiments of the present invention, the apparatus may take the form of a computer program product with a program code, which program code is stored on a computer readable medium, for carrying out steps of a method comprising receiving such a request to access such a memory array having one or more memory erase units with such a data area of flash array and with such a specific amount of memory which offers small data programming capability; and if the memory access request includes programming small data, then providing access to the specific amount of memory, or if the memory access request does not include programming small data, then providing access to the data area of flash array, when the computer program is run in a module of user equipment, such as a mobile phone, terminal or device.

In some embodiments of the invention, the flash memory device may be implemented in conjunction with, or form part of, a flash file system, including where the flash file system data structures for a data unit can be located in the specific amount of memory. By using the new technique, the same flash file system structure would be available in several memory devices from several memory manufacturers, this could also simplify the flash memory structure as not all memory cells would need to be able support several programming modes. In LP-DDR2 overlay window can be utilized for this but not with current NOR.

BRIEF DESCRIPTION OF THE DRAWING

The drawing includes the following Figures, which are not necessarily drawn to scale:

FIG. 1 shows a flow chart of a method having basic steps of some embodiments of the present invention.

FIG. 2 shows a flash memory device according to some embodiments of the present invention.

FIG. 5 shows a system according to some embodiments of the present invention.

BEST MODE OF THE INVENTION

Figure 3:
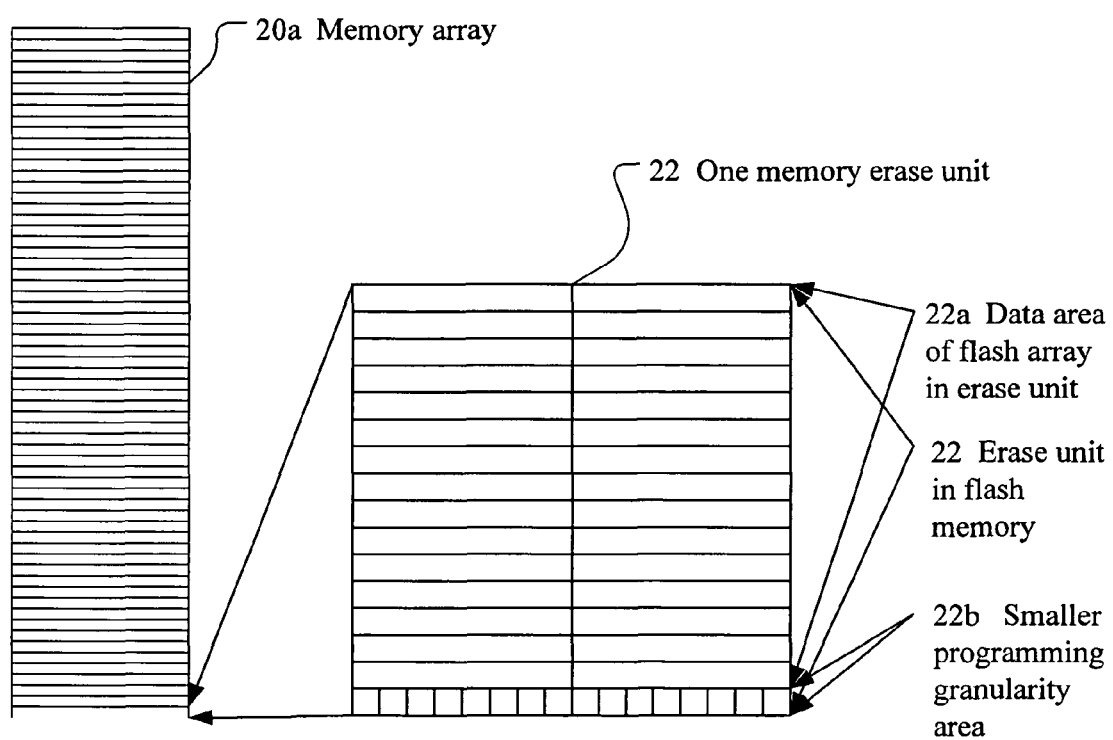
FIG. 3 shows an example of a Mux-NOR interface device from a flash file system point of view according to some embodiments of the present invention.

FIGS. 1-5 show a new and unique technique for providing small programming capability in non-volatile flash memory, according to the present invention.

By way of example, FIG. 1 shows a flowchart generally indicated as 10 of a method according to the present invention having steps 10a, 10b, which include receiving a request to access a memory array having one or more memory erase units with a data area of flash array and with a specific amount of memory which offers small data programming capability; and if the memory access request includes programming small data, then providing access to the specific amount of memory, or if the memory access request does not include programming small data, then providing access to the data area of flash array. The accessing may include memory programming capabilities such as reading, writing or erasing the programming data to or from the specific amount of memory. The scope of the invention is also intended to include other memory programming capabilities either now known or later developed in the future. By way of example, the small data may include validity information data; however, consistent with that shown and described herein, the scope of the invention is not intended to be limited to any particular type or kind of small data either now known or later developed in the future.

In the present invention, "small data" (e.g. validity or sector status information) may be required only for file system data blocks (e.g. not for code). It can be, for example, 8 bytes in size. If this data was written into the error correction area, it would waste huge amount of memory. With "small write" areas according to the present invention, both programming modes need not to be supported by all memory cells.

According to some embodiments of the present invention, the size of the specific amount of memory may be pre-defined; the specific amount of memory may be a different memory technology; the specific amount of memory can be erased simultaneously or with sequentially with the main block of the memory array; the specific amount of memory may be located physically in the same location in the one or more memory erase units; the specific amount of memory may be located physically in a separate location in the one or more memory erase units; the specific amount of memory may be erased simultaneously, including by using one command or sequential commands; the specific amount of memory can be mapped inside an overlay window, where the overlay window can be mapped to any address, or where the specific amount of memory may not be visible until overlap mapping is changed again; or some combination of these features. Moreover, embodiments are envisioned in which programming the device/small data can be implemented by using a programming buffer or single word programming, although the scope of the invention is not intended to include needing to use such a programming buffer. In this case, the buffer size can also be optimized to offer better performance of the device and cost for having integrated RAM in the memory device.

FIGS. 2-3 shows a flash memory device generally indicated as 20 (FIG. 2) having a memory array 20a and a memory controller 20b, according to some embodiments of the present invention. The memory array 20a has one or more memory erase units 22 with a data area of flash array 22a and with a specific amount of memory 22b which offers small data programming capability, as shown in FIG. 3. As shown, a small programming area 22b can be located physically in the same location in a flash memory erase unit 22 or in a separate location, but erasing of those areas can be done simultaneously (with one command or sequential commands). In operation, the memory controller 20b responds to a memory access request, for example, from a device (see FIG. 5), and is configured to provide access to the specific amount of memory 22b if the request includes programming small data, or to provide access to the data area of flash array 22a if the memory access request does not include programming small data.

In particular, FIG. 3 shows, by way of example, how the memory array 20a can be implemented from a file system point of view to a Mux-NOR interface. Basically, this embodiment allows the use of different memory cells in the flash memory device for different areas. Both areas are visible in the same memory array (addresses are sequential). There may be 126 kB of data area and 2 kB of small data area (which offers smaller data programming possibility). However, the scope of the invention is not intended to be limited to the size of the areas or combinations thereof; for example, embodiments are envisioned using other sizes such as 252 kB and 4 kB combination, or a 63 kB and 1 kB combination, as well as other sizes and combinations. In some embodiments of the present invention, all erase units are similar so memory device may read in similar way independently of location, this is needed for code execution.

Figure 4:
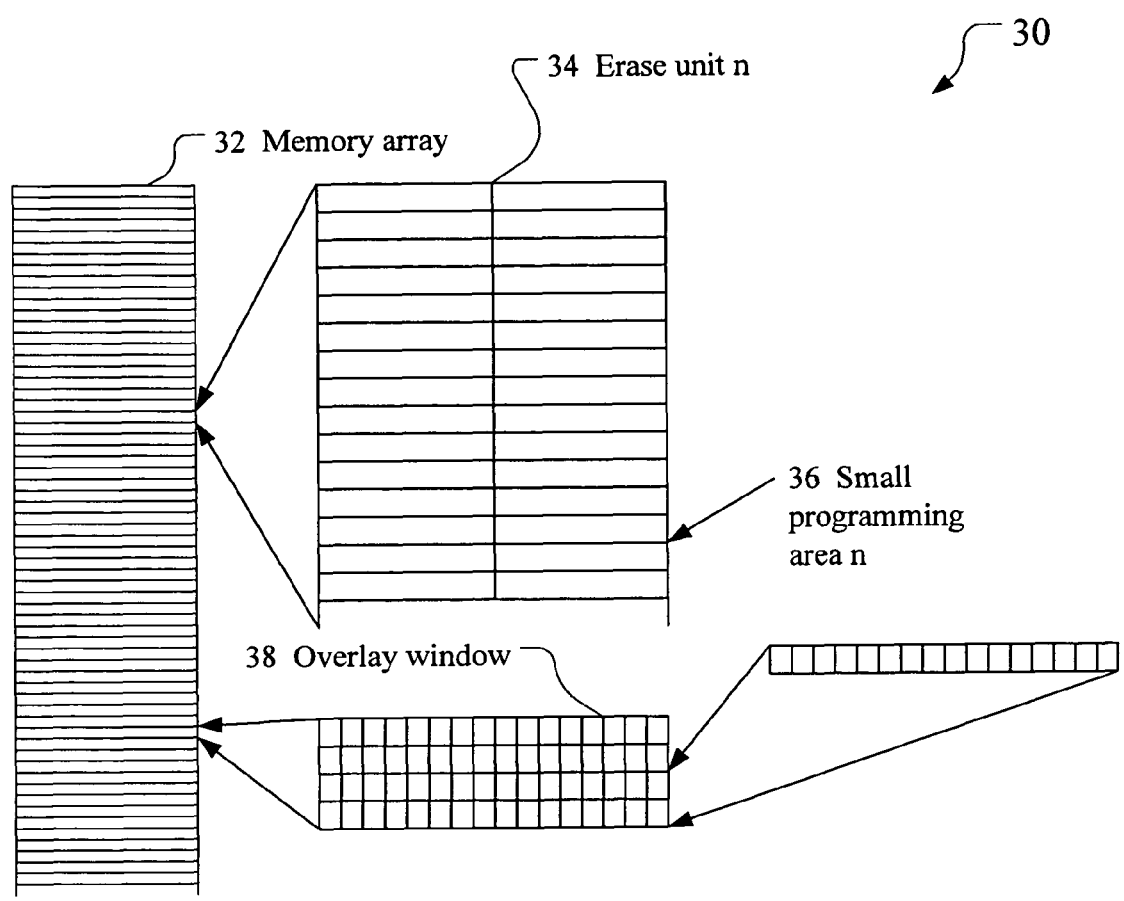
FIG. 4 shows an example a memory device in LP-DDR2 interface according to some embodiments of the present invention.

FIG. 4 shows an alternative embodiment having a combination generally indicated as 30 for use in relation to an LP-DDR2 interface. The combination 30 would form part of a flash memory device like 20 shown in FIG. 3 and have a memory controller like 20b shown in FIG. 3. The combination 30 provides an even more advanced method than that shown in FIG. 3. As shown, the combination 30 includes a memory array 32 and one or more erase units 34 having small data programming area 36 that would be visible through an overlay window 36 which is mapped to some memory array location for the time when it needs to be accessed. In effect, a respective small programming area 36 for each erase unit 34 can be mapped inside the overlay window 38, and the overlay window 38 can be mapped to any address but as a side effect that the area in the memory device is not visible until overlay mapping is changed again. For this kind of implementation, the main area of each erase unit 34 could be, for example, 64 kB, 128 kB, 256 kB or 512 kB (or any multiple of 8 kB) and small data area would be, for example, 1 kB for each 64 kB.

This new and unique technique creates the possibility to simplify the memory device and flash file system.

System Implementation

FIG. 5 shows a system generally indicated as 40 according to some embodiments of the present invention, having a device 42 and a flash memory device 44.

The device 42 is configured for providing the memory access request to the flash memory device 44, and may take the form of an input/output (I/O) device, or other suitable device for providing such a request. The scope of the invention is not intended to be limited to any particular type or kind of device that provides the request.

The flash memory device 44 includes a memory array 44a and a memory controller 44b. The memory array 44a has one or more memory erase units such as 22 in FIG. 3 or 34 in FIG. 4. The memory erase unit has a data area of flash array such as 22a in FIG. 3, and also has a specific amount of memory such as 22b in FIG. 3 or 36 in FIG. 4 which offers small data programming capability. In operation, the flash memory device 44 responds to the memory access request, and the memory controller 44b either provides access to the specific amount of memory in the memory array 44a if the memory access request includes programming small data, or provides access to the data area of flash array 44a if the memory access request does not include programming small data.

Implementation of the Functionality of Controller 20b

By way of example, and consistent with that described herein, the functionality of the memory controller 20b may be implemented using hardware, software, firmware, or a combination thereof, although the scope of the invention is not intended to be limited to any particular embodiment thereof. In a typical software implementation, the controller 20b would be one or more microprocessor-based architectures having a microprocessor, a random access memory (RAM), a read only memory (ROM), input/output devices and control, data and address buses connecting the same. A person skilled in the art would be able to program such a microprocessor-based implementation to perform the functionality described herein without undue experimentation. The scope of the invention is not intended to be limited to any particular implementation using technology now known or later developed in the future. Moreover, the scope of the invention is intended to include the controller 20b forming part of the flash memory, being implemented as a stand alone module, being implemented in the combination with other circuitry for implementing another module, or being implemented in another way either now known or later developed in the future. Moreover, the real-time part may be implemented in hardware, while non real-time part may be done in software.

Abbreviations

Byte=8 bits
kB=kilobyte, 1024 bytes
Mux-NOR=Address/Data multiplexed NOR interface
NOR=non volatile flash memory which is byte/word accessible
Word=16 bits Scope of the Invention Accordingly, the invention comprises the features of construction, combination of elements, and arrangement of parts which will be exemplified in the construction hereinafter set forth.

It will thus be seen that the objects set forth above, and those made apparent from the preceding description, are efficiently attained and, since certain changes may be made in the above construction without departing from the scope of the invention, it is intended that all matter contained in the above description or shown in the accompanying drawing shall be interpreted as illustrative and not in a limiting sense.

What is claimed is:

1. A method comprising:
receiving a request to access a memory array comprising one or more memory erase units, said one or more memory erase units comprising a data area of flash array and a specific amount of memory which offers small data programming capability, wherein the specific amount of memory is configured to be erased simultaneously with a main memory block of the memory array using one command or sequential commands; and
if the memory access request includes programming small data, then providing access to the specific amount of memory, or
if the memory access request does not include programming small data, then providing access to the data area of flash array;
wherein a size of the specific amount of memory of a corresponding memory erase unit is pre-defined so as to be between 1.5 percent and 1.6 percent of a size of said data area of flash array of the corresponding memory erase unit.

2. A method according to claim 1, wherein a small data area is located into the same memory erase unit as a main block or into a different memory erase unit main block.

3. A method according to claim 1, wherein the accessing may include memory programming capabilities, including reading, writing or erasing the programming data to or from the specific amount of memory.

4. A method according to claim 1, wherein the specific amount of memory may be erased simultaneously, including by using one command or sequential commands.

5. A method according to claim 1, wherein the memory array forms part of an address/data multiplexed NOR interface memory device.

6. A method according to claim 1, wherein the memory array forms part of a low power double data rate II interface memory device or a standard NOR interface.

7. A method according to claim 1, wherein the method further comprises implementing the method via a computer program running in a processor, controller or other suitable module in the user equipment, including a mobile phone, terminal or device.

8. A method according to claim 1, wherein the flash memory device forms part of a flash file system.

9. A method according to claim 1, wherein the small data includes validity information data or sector status information data.

10. A method according to claim 1 wherein the size of the specific amount of memory of the corresponding memory erase unit is pre-defined so as to comprise 1 kB for each 63 kB of the size of said data area of flash array of the corresponding memory erase unit.

11. A method according to claim 1 wherein the size of the specific amount of memory of the corresponding memory erase unit is pre-defined so as to comprise 1 kB for each 64 kB of the size of said data area of flash array of the corresponding memory erase unit.

12. A method according to claim 1, wherein the specific amount of, memory can be mapped inside an overlay window.

13. A method according to claim 12, wherein the overlay window can be mapped to any address.

14. A method according to claim 12, wherein the specific amount of memory is not visible until overlay mapping is changed again.

15. A method according to claim 1, wherein the specific amount of memory and the main memory block comprise a different memory technology.

16. A method according to claim 15 wherein the size of the specific amount of memory of the corresponding memory erase unit is pre-defined so as to comprise 1 kB for each 63 kB of the size of said data area of flash array of the corresponding memory erase unit.

17. A method according to claim 15 wherein the size of the specific amount of memory of the corresponding memory erase unit is pre-defined so as to comprise 1 kB for each 64 kB of the size of said data area of flash array of the corresponding memory erase unit.

18. A flash memory device comprising:
a memory array comprising one or more memory erase units, said one or more memory erase units comprising a data area of flash array and a specific amount of memory which offers small data programming capability, wherein the specific amount of memory is configured to be erased simultaneously with a main memory block of the memory array using one command or sequential commands; and
a memory controller configured to respond to a request, and to provide access to the specific amount of memory if the memory access request includes programming small data, or to provide access to the data area of flash array if the memory access request does not include programming small data;
wherein a size of the specific amount of memory of a corresponding memory erase unit is pre-defined so as to be between 1.5 percent and 1.6 percent of a size of said data area of flash array of the corresponding memory erase unit.

19. A flash memory device according to claim 18, wherein the specific amount of memory and the main memory block comprise a different memory technology.

20. A flash memory device according to claim 18, wherein a small data area is located into the same memory erase unit as a main block or into a different memory erase unit as the main block.

21. A flash memory device according to claim 18, wherein the specific amount of memory is located physically in the same location in the one or more memory erase units.

22. A flash memory device according to claim 18, wherein the accessing may include memory programming capabilities, including reading, writing or erasing the programming data to or from the specific amount of memory.

23. A flash memory device according to claim 18, wherein the flash memory device forms part of an address/data multiplexed NOR interface memory device.

24. A flash memory device according to claim 18, wherein the flash memory device forms part of a low power double data rate II interface memory device or a standard NOR interface.

25. A flash memory device according to claim 18, wherein the small data includes validity information data or sector status information data.

26. A flash memory device according to claim 18, wherein the specific amount of memory can be mapped inside an overlay window.

27. A flash memory device according to claim 26, wherein the overlay window can be mapped to any address.

28. A flash memory device according to claim 26, wherein the specific amount of memory is not visible until overlay mapping is changed again.

29. A computer program product with a program code, which program code is stored on a non-transitory computer readable medium, for carrying out a method comprising receiving a request to access a memory array having one or more memory erase units, said one or more memory erase units comprising a data area of flash array and a specific amount of memory which offers small data programming capability, wherein the specific amount of memory is configured to be erased simultaneously with a main memory block of the memory array using one command or sequential commands; and if the memory access request includes programming small data, then providing access to the specific amount of memory, or if the memory access request does not include programming small data, then providing access to the data area of flash array, when the computer program is run in a module of user equipment, including a mobile phone, terminal or device;
- wherein a size of the specific amount of memory of corresponding memory erase unit is pre-defined so as to be between 1.5 percent and 1.6 percent of a size of said data area of flash array of the corresponding memory erase unit.

30. A system comprising:
- a device configured to provide a request; and
- a flash memory device comprising
- a memory array comprising one or more memory erase units, said one or more memory erase units comprising a data area of flash array and a specific amount of memory which offers small data programming capability, wherein the specific amount of memory is configured to be erased simultaneously with a main memory block of the memory array using one command or sequential commands; and
- a memory controller configured to respond to the request, and to provide access to the specific amount of memory if the memory access request includes programming small data, or to provide access to the data area of flash array if the memory access request does not include programming small data;
- wherein a size of the specific amount of memory of a corresponding memory erase unit is pre-defined so as to be between 1.5 percent and 1.6 percent of a size of said data area of flash array of the corresponding memory erase unit.

31. A system according to claim 30, wherein the specific amount of memory and the main memory block comprise is a different memory technology.

32. A system according to claim 30, wherein a small data area is located into the same memory erase unit as a main block or into a different memory erase unit as the main block.

33. A system according to claim 30, wherein the accessing may include memory programming capabilities, including reading, writing or erasing the programming data to or from the specific amount of memory.

34. A system according to claim 30, wherein the specific amount of memory is located physically in a separate location in the one or more memory erase units.

35. A system according to claim 30 wherein the flash memory device forms part of an address/data multiplexed NOR interface memory device.

36. A system according to claim 30, wherein the flash memory device forms part of a low power double data rate II interface memory device or a standard NOR interface.

37. A system according to claim 30, wherein the small data includes validity information data or sector status information data.

38. A system according to claim 30, wherein the specific amount of memory can be mapped inside an overlay window.

39. A system according to claim 38, wherein the overlay window can be mapped to any address.

40. A system according to claim 38, wherein the specific amount of memory is not visible until overlay mapping is changed again.

41. Apparatus comprising:
- means for receiving a request to access a memory array comprising one or more memory erase units, said one or more memory erase units comprising a data area of flash array and a specific amount of memory which, offers small data programming capability, wherein the specific amount of memory is configured to be erased simultaneously with a main memory block of the memory array using one command or sequential commands; and
- means for providing access to the specific amount of memory if the memory access request includes programming small data, or for providing access to the data area of flash array if the memory access request does not include programming small data;
- wherein a size of the specific amount of memory of a corresponding memory erase unit is pre-defined so as to be between 1.5 percent and 1.6 percent of a size of said data area of flash array of the corresponding memory erase unit.

42. Apparatus comprising:
- means for providing one or more memory erase units said one or more memory erase units comprising a data area of flash array and a specific amount of memory which offers small data programming capability, wherein the specific amount of memory configured to be erased simultaneously with a main memory block of the memory array using one command or sequential commands; and
- means, responsive to a request, for providing access to the specific amount of memory if the memory access request includes programming small data, or for providing access to the data area of flash array if the memory access request does not include programming small data;
- wherein a size of the specific amount of memory of a corresponding memory erase unit is pre-defined so as to be between 1.5 percent and 1.6 percent of a size of said data area of flash array of the corresponding memory erase unit.

* * * * *